United States Patent
Baghlani et al.

(10) Patent No.: US 11,012,161 B1
(45) Date of Patent: May 18, 2021

(54) TRANSCEIVER AND METHOD FOR UNDERSEA COMMUNICATION

(71) Applicants: Ahmad Fakher Jasem Baghlani, Safat (KW); Wadhha S. M. S. Albaho, Safat (KW)

(72) Inventors: Ahmad Fakher Jasem Baghlani, Safat (KW); Wadhha S. M. S. Albaho, Safat (KW)

(*) Notice: Subject to any disclaimer, the term of this patent is extended or adjusted under 35 U.S.C. 154(b) by 0 days.

(21) Appl. No.: 16/911,367

(22) Filed: Jun. 24, 2020

(51) Int. Cl.
| | | |
|---|---|---|
| *H04B 13/02* | (2006.01) | |
| *H04B 1/40* | (2015.01) | |
| *G01R 27/16* | (2006.01) | |
| *H01Q 1/36* | (2006.01) | |
| *H01Q 1/04* | (2006.01) | |
| *H04J 11/00* | (2006.01) | |
| *H04B 1/66* | (2006.01) | |

(52) U.S. Cl.
CPC ............ *H04B 13/02* (2013.01); *G01R 27/16* (2013.01); *H01Q 1/04* (2013.01); *H01Q 1/364* (2013.01); *H04B 1/40* (2013.01); *H04B 1/66* (2013.01); *H04J 11/00* (2013.01)

(58) Field of Classification Search
CPC .. H04B 11/00; H04B 13/02; H04B 10/25891; H04B 10/40; H04B 13/00; H04B 14/00; H04B 17/27; H04B 1/66
USPC .......................................... 375/130; 313/329
See application file for complete search history.

(56) References Cited

U.S. PATENT DOCUMENTS

| | | |
|---|---|---|
| 6,875,369 B1 | 4/2005 | Tidrow et al. |
| 8,682,244 B2 | 3/2014 | Rhodes et al. |
| 9,281,798 B2 | 3/2016 | David et al. |
| 2004/0153270 A1* | 8/2004 | Yamashita ........... G01N 33/383 702/81 |

(Continued)

OTHER PUBLICATIONS

Li et al., "Correlated Perovskites as a New Platform for Super-Broadband-Tunable Photonics," Advanced Materials, 28.41, Aug. 2016, 9117-9125.

(Continued)

*Primary Examiner* — David C Payne
*Assistant Examiner* — Sarah Hassan
(74) *Attorney, Agent, or Firm* — Nath, Goldberg & Meyer; Richard C. Litman

(57) ABSTRACT

The transceiver for undersea communication includes both a receiver and a transmitter. The transmitter includes a transmitter digital signal processor for converting a transmitted communication signal into a modulated transmission signal. The transmitter digital signal processor applies a modulation scheme to the transmitted communication signal during its conversion into the modulated transmission signal. The transmitter converts the modulated transmission signal into modulated electrical pulses, which are applied to electrodes to produce a modulated electric field. The receiver includes a receiving antenna formed from samarium nickelate ($SmNiO_3$). Samarium nickelate (SNO) is known to have measurable changes in resistance responsive to changes in applied sub-volt electric potentials when the samarium nickelate is immersed in salt water, such as in an undersea environment. The electrical resistance of the receiving antenna is measured to generate a resistance variation signal, which is converted by a receiver digital signal processor into a received communication signal.

2 Claims, 2 Drawing Sheets

(56) References Cited

U.S. PATENT DOCUMENTS

2011/0216626 A1\* 9/2011 Stacey .................. H04B 11/00
 367/131
2012/0105246 A1 5/2012 Sexton et al.
2018/0059440 A1\* 3/2018 Yu ........................ G11C 13/048

OTHER PUBLICATIONS

Zhang, et al., "Perovskite nickelates as electric-field sensors in salt water," Nature, 553, 68-72, Dec. 18, 2017.
Oubei et al., "Light based underwater wireless communications," Japanese Journal of Applied Physics, 57, 8S2, Jul. 17, 2018.
Kang et al., "Ultraviolet-to-blue color-converting scintillating-fibers photoreceiver for 375-nm laser-based underwater wireless optical communication," Optics Express, 27. 21 Oct. 14, 2019.
Lawry, Tristan J., et al. "A high-performance ultrasonic transceiver for the simultaneous transmission of data and power through solid metal barriers." IEEE transactions on ultrasonics, ferroelectrics, and frequency control 60.1 (2012): 194-203.

\* cited by examiner

TRANSCEIVER AND METHOD FOR UNDERSEA COMMUNICATION

BACKGROUND

1. Field

The disclosure of the present patent application relates to undersea communication, and particularly to a transceiver and method for undersea communication using modulated electric fields and a samarium nickelate (SNO)-based receiver.

2. Description of the Related Art

With numerous industries moving to underwater operations, there is a need to provide reliable, secure and high data rate underwater wireless communication (UWC) systems. Such systems have numerous practical applications, such as real-time video transmission, monitoring of offshore floating oil production platforms, military submarine communications, environmental surveying and monitoring, and the like. At present, acoustic communication is the most dominant technique for underwater wireless links. Acoustic communication allows for long distance communication, typically on the order of ten kilometers. However, underwater acoustic communication is limited to low frequencies (approximately 10 Hz to 1 MHz), and such low frequency limitations compromise the system bandwidth, thus limiting the transmission data rate to low values (on the order of kbps). Other limitations of underwater acoustics include high latency, due to slow propagation of sound waves in seawater (approximately 1500 m/s), time varying multipath propagation, Doppler spread, and bulky and power hungry transceiver modules.

Although fiber optic technology provides long link ranges with high transmission data rates (up to 1 Gbps or more), such fiber optic-based systems require both the transmitter and receiver to be physically connected via a cable. This is undesirable for many tactical applications, such as communication for autonomous underwater vehicles (AUVs). Radio frequency (RF) is another technology that can provide tens of Mbps data rates in underwater communication, but it is limited to very short link ranges (typically a few meters) due to the high conductivity of seawater. The salt water highly attenuates RF waves, thus making the range impractical for anything other than very near range communication. Additionally, underwater RF systems require relatively large antennas, high energy consumption, and high costs.

RF communication is well known, well understood and provides protocols applicable to almost any common application. It would be desirable to be able to provide such versatility and well-known technology to an undersea environment, particularly by taking advantage of the same conductive medium (i.e., salt water) that hampers conventional RF communication systems. Thus, a transceiver and method for undersea communication solving the aforementioned problems is desired.

SUMMARY

The transceiver for undersea communication includes both a receiver and a transmitter. The transmitter includes a transmitter digital signal processor for converting a transmitted communication signal into a modulated transmission signal. The transmitter digital signal processor may apply any suitable type of modulation, such as amplitude modulation (AM), quadrature phase shift keying (QPSK) modulation or the like (as is well known in conventional radio communication) to the transmitted communication signal during its conversion into the modulated transmission signal. Additional digital transmission protocols, such as orthogonal frequency-division multiplexing (OFDM), may also be applied to encode the digital data on multiple carrier frequencies. The transmitter operates in a manner similar to a conventional digital radio transmitter, except that instead of transmitting the modulated transmission signal through a conventional radio antenna, an isolator circuit converts the modulated OFDM digital signal into modulated electrical pulses, which are applied to electrodes to produce a modulated electric field. The conductive salt water of the undersea environment serves as a transmission medium for the modulated electric field.

The receiver includes a receiving antenna formed from samarium nickelate ($SmNiO_3$). Samarium nickelate (SNO) is known to have measurable changes in resistance responsive to changes in applied sub-volt electric potentials when the samarium nickelate is immersed in salt water, such as in an undersea environment. The electrical resistance of the receiving antenna is measured to generate a resistance variation signal, which is converted by a receiver digital signal processor into a received communication signal. The variation of electrical resistance is due to the variation of electrical potential in the SNO receiving antenna, caused by the modulated electric field generated by the transmitter.

The receiver digital signal processor may apply any suitable type of demodulation, such as AM, QPSK demodulation or the like (i.e., matching the type of modulation used by the transmitter), to the resistance variation signal during its conversion into the received communication signal. If the transmitter uses OFDM, then the receiver digital signal processor further applies orthogonal frequency-division demultiplexing to return to a single communication channel.

These and other features of the present subject matter will become readily apparent upon further review of the following specification.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
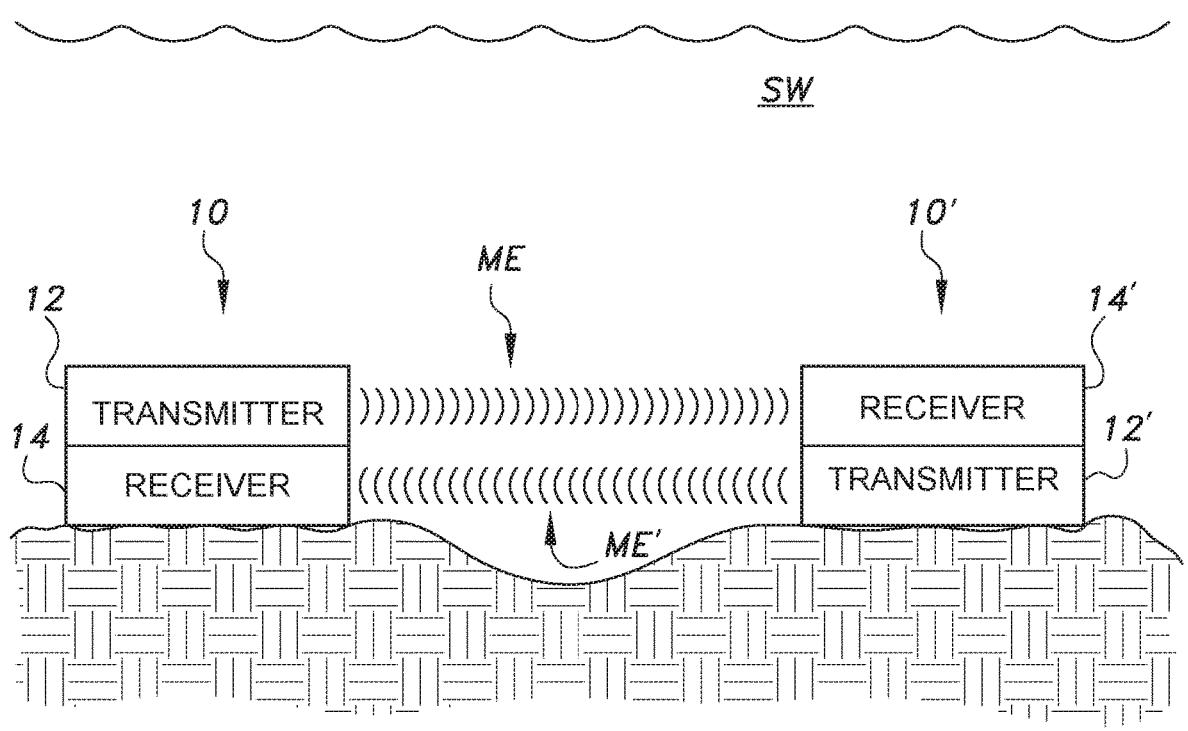
FIG. 1 is a diagram of an undersea communications system using a transceiver for undersea communication.
Figure 2:
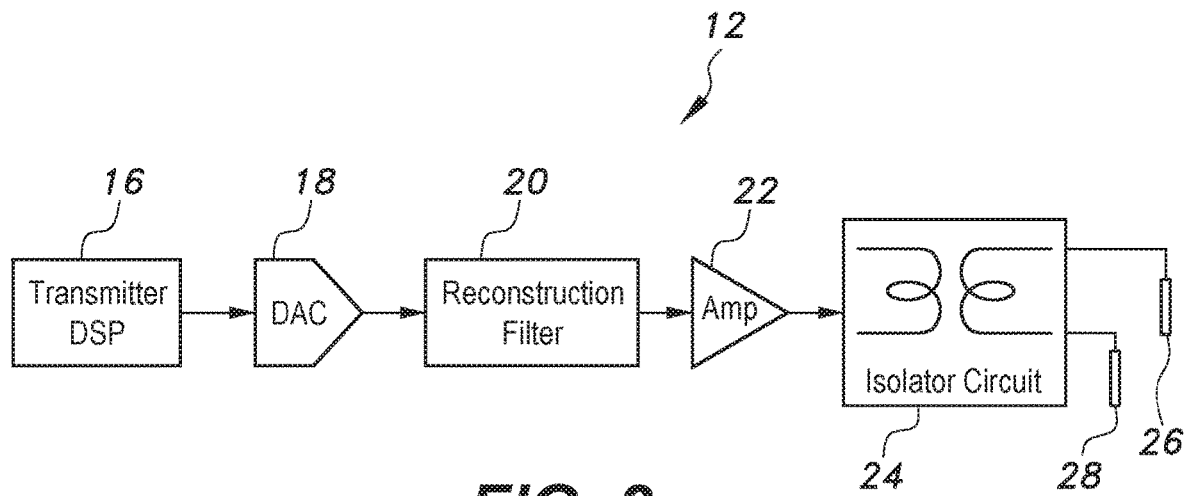
FIG. 2 is a block diagram of a transmitter module of the transceiver for undersea communication.

The transceiver for undersea communication 10 includes both a transmitter 12 and a receiver 14. In FIG. 1, transceiver 10 is shown communicating with transceiver 10' in salt water (SW), such as an undersea environment. As shown in FIG. 2, transmitter 12 of transceiver 10 operates in a manner similar to a conventional radio transmitter. However, rather than a conventional radio antenna, transmitter electrodes 26, 28 produce a modulated electric field ME. In FIG. 1, transceiver 10', which is shown as including a transmitter 12' and a receiver 14', emits a modulated electric field ME'. It should be understood that transceiver 10 and transceiver 10' operate in identical manner.

As shown in FIG. 2, transmitter 12 includes a transmitter digital signal processor (DSP) 16 for converting a transmitted communication signal into a modulated transmission signal. The transmitter digital signal processor 16 may apply any suitable type of modulation, such as amplitude modulation (AM), quadrature phase shift keying (QPSK) modulation, or the like (as is well known in conventional radio communication) to the transmitted communication signal during its conversion into the modulated transmission signal. Additional digital transmission protocols, such as orthogonal frequency-division multiplexing (OFDM), may also be applied to encode the digital data on multiple carrier frequencies. An example of an OFDM-based transmitter that may be coupled with QPSK modulation is described in Lawry, Tristan J., et al. "A high-performance ultrasonic transceiver for the simultaneous transmission of data and power through solid metal barriers." *IEEE transactions on ultrasonics, ferroelectrics, and frequency control* 60.1 (2012): 194-203, which is hereby incorporated by reference.

In the example of FIG. 2, which applies OFDM, the transmitter DSP 16 encodes the transmitted communication signal to generate discrete-time OFDM symbols, which are passed to a high-speed digital-to-analog converter (DAC) 18. A reconstruction filter 20 is used to create a smooth continuous-time OFDM signal. The signal is then passed through an amplifier 22, followed by an isolator circuit 24 for converting the modulated OFDM digital signal into modulated electrical pulses, which are applied to electrodes 26, 28 to produce the modulated electric field ME. The transmitter 12 operates in a manner similar to a conventional digital radio transmitter, except that instead of transmitting the modulated transmission signal through a conventional radio antenna, isolator circuit 24 converts the modulated OFDM digital signal into the modulated electrical pulses, which are applied to electrodes 26, 28 to produce the modulated electric field ME, which is used to transmit information or data to the receiver 14' of transceiver 10'. The conductive salt water SW of the undersea environment serves as a transmission medium for the modulated electric field ME.

The receiver 14 includes a receiving antenna formed from samarium nickelate ($SmNiO_3$). Samarium nickelate (SNO) is known to have measurable changes in resistance responsive to changes in applied sub-volt electric potentials when the samarium nickelate is immersed in salt water, such as in an undersea environment. The electrical resistance of the receiving antenna is measured to generate a resistance variation signal, which is converted by a receiver digital signal processor 40 (shown in FIG. 3A) into a received communication signal. The variation of electrical resistance is due to the variation of electrical potential in the SNO receiving antenna caused by the modulated electric field generated by the transmitter 12. The physical mechanism behind the resistance variation found in SNO in salt water when exposed to a varying bias potential or external electric field is described in Zhang, Zhen, et al. "Perovskite nickelates as electric-field sensors in salt water." *Nature* 553.7686 (2018): 68-72, which is hereby incorporated by reference.

Figure 3A:
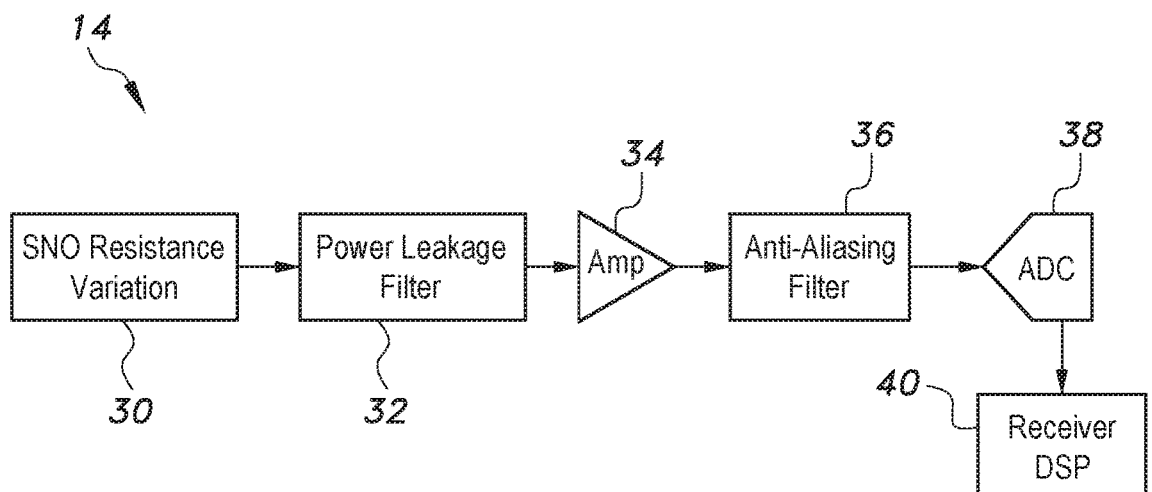
FIG. 3A is a block diagram of a receiver module of the transceiver for undersea communication.
Figure 3B:
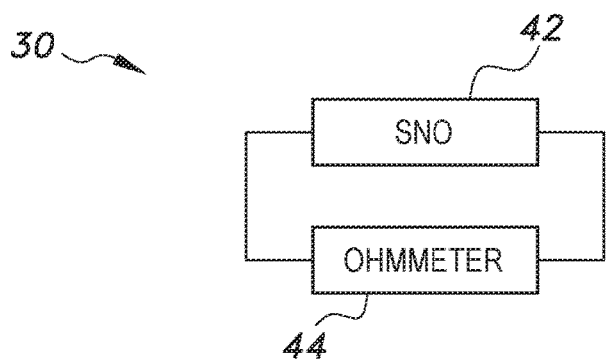
FIG. 3B is a block diagram of a receiver antenna front end of the receiver of FIG. 3A.

As shown in FIGS. 3A and 3B, receiver 14 includes a primary receiving unit 30 for measuring resistance variation in the receiving antenna 42, which is made of SNO, which may be in the form of a thin film of SNO on a substrate or the like. The resistance in SNO in the antenna 42 may be measured by an ohmmeter 44 or any other suitable type of device for measuring electrical resistance. Ohmmeter 44 produces the resistance variation signal, which is the unprocessed signal received by receiver 14.

As shown in FIG. 3A, in order to compensate for any leakage in the resistance variation signal generated by ohmmeter 44 of unit 30, a power leakage filter 32 may be applied to filter any signal leakage into an adjacent OFDM communication channel. Following the OFDM example given above for transmitter 12, receiver 14 may be an OFDM receiver. As in a conventional OFDM receiver, such as that described in Lawry, Tristan J., et al. "A high-performance ultrasonic transceiver for the simultaneous transmission of data and power through solid metal barriers." *IEEE transactions on ultrasonics, ferroelectrics, and frequency control* 60.1 (2012): 194-203, the recovered OFDM signal is then passed through an amplifier 34 and an anti-aliasing filter 36, followed by sampling through a high-speed analog-to-digital converter (ADC) 38. The processed signal is then finally passed to the receiver's digital signal processor (DSP) 40 for conversion into a readable communication signal for the receiving party. The receiver digital signal processor 40 may apply any suitable type of demodulation, such as AM, QPSK demodulation, or the like (i.e., matching the type of modulation used by transmitter 12), to the resistance variation signal during its conversion into the received communication signal. If the transmitter uses OFDM, then the receiver digital signal processor 40 further applies orthogonal frequency-division demultiplexing to return to a single communication channel.

In the example of FIG. 1, only two such transceivers 10, 10' are shown. It should be understood that any desired number of transceivers may be networked together, similar to a conventional wireless network using carrier-sense multiple access (CSMA), for example, or any other suitable type of wireless networking protocol.

It is to be understood that the transceiver and method for undersea communication is not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

We claim:

1. A transceiver for undersea communication, comprising:
 a receiver module having:
  a receiving antenna made from samarium nickelate;
  an ohmmeter, the ohmmeter being in electrical communication with the receiving antenna for measuring an electrical resistance of the receiving antenna and generating a resistance variation signal; and
  a receiver digital signal processor for converting the resistance variation signal into a received communication signal, wherein the receiver digital signal processor comprises an orthogonal frequency division demultiplexer; and
 a transmitter module having:
  a transmitter digital signal processor for converting a transmitted communication signal into a modulated transmission signal, wherein the transmitter digital signal processor comprises an orthogonal frequency division multiplexer; and
  an isolator circuit for converting the modulated digital signal into modulated electrical pulses, wherein the modulated electrical pulses are in electrical communication with at least one electrode to produce a modulated electric field.

2. A method for undersea communication, comprising the steps of:

providing a transceiver for undersea communication, the transceiver comprising:

a receiver module having:

a receiving antenna made from samarium nickelate;

an ohmmeter, the ohmmeter being in electrical communication with the receiving antenna for measuring an electrical resistance of the receiving antenna and generating a resistance variation signal; and a receiver digital signal processor for converting the resistance variation signal into a received communication signal, wherein the receiver digital signal processor comprises an orthogonal frequency division demultiplexer; and a transmitter module having:

a transmitter digital signal processor for converting a transmitted communication signal into a modulated transmission signal, wherein the transmitter digital signal processor comprises an orthogonal frequency division multiplexer; and an isolator circuit for converting the modulated digital signal into modulated electrical pulses, wherein the modulated electrical pulses are in electrical communication with at least one electrode to produce a modulated electric field;

measuring electrical resistance of the receiving antenna immersed in salt water;

generating a resistance variation signal, wherein the step of converting the resistance variation signal into a received communication signal comprises orthogonal frequency division demultiplexing;

converting the resistance variation signal into a received communication signal;

generating a modulated electric field; and receiving the modulated electric field at the receiving antenna.

* * * * *